United States Patent
Kurosawa et al.

(10) Patent No.: US 11,305,994 B2
(45) Date of Patent: Apr. 19, 2022

(54) METHOD FOR REFINING ARGON GAS AND RECOVERING AND REFINING APPARATUS FOR ARGON GAS

(71) Applicant: SHIN-ETSU HANDOTAI CO., LTD., Tokyo (JP)

(72) Inventors: Yasushi Kurosawa, Annaka (JP); Hideaki Matsushima, Nasushiobara (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 754 days.

(21) Appl. No.: 15/557,677

(22) PCT Filed: Feb. 24, 2016

(86) PCT No.: PCT/JP2016/000988
§ 371 (c)(1),
(2) Date: Sep. 12, 2017

(87) PCT Pub. No.: WO2016/152027
PCT Pub. Date: Sep. 29, 2016

(65) Prior Publication Data
US 2018/0050912 A1 Feb. 22, 2018

(30) Foreign Application Priority Data
Mar. 24, 2015 (JP) ............................. JP2015-060405

(51) Int. Cl.
*C01B 23/00* (2006.01)
*C30B 29/06* (2006.01)
(Continued)

(52) U.S. Cl.
CPC .......... *C01B 23/0021* (2013.01); *C30B 29/06* (2013.01); *B01D 53/02* (2013.01);
(Continued)

(58) Field of Classification Search
CPC ........ C01B 23/0029; C01B 2210/0034; C01B 23/0021; C01B 13/024; C01B 32/50;
(Continued)

(56) References Cited

FOREIGN PATENT DOCUMENTS

| CN | 103569979 A | 2/2014 |
|---|---|---|
| JP | S62-119104 A | 5/1987 |
| JP | H02-282682 A | 11/1990 |
| JP | 2011-173769 A | 9/2011 |

(Continued)

OTHER PUBLICATIONS

Apr. 26, 2016 International Search Report issued in International Patent Application No. PCT/JP2016/000988.
(Continued)

*Primary Examiner* — Anthony J Zimmer
*Assistant Examiner* — Syed T Iqbal
(74) *Attorney, Agent, or Firm* — Oliff PLC (57) ABSTRACT

A method is provided for refining an argon gas, in which oxygen is added to the argon gas containing hydrogen, carbon monoxide (CO), and oxygen as impurities so that the hydrogen and the CO are converted into water and carbon dioxide in a catalyst tower, or hydrogen is added to the argon gas so that the oxygen is converted into the water; the method including: monitoring the hydrogen, the CO, and the oxygen on an outlet side of the catalyst tower; and at least one of adding the oxygen to the argon gas when any one of the hydrogen and the CO is detected on the outlet side of the catalyst tower, and adding the hydrogen when the oxygen is detected, wherein the oxygen or the hydrogen to be added is intermittently added to the catalyst tower relative to continuous supply of the argon gas to the catalyst tower.

5 Claims, 5 Drawing Sheets (51) Int. Cl.
  *C01B 32/50* (2017.01)
  *B01D 53/02* (2006.01)
  *C01B 13/02* (2006.01)

(52) U.S. Cl.
  CPC ...... *B01D 2257/504* (2013.01); *C01B 13/024* (2013.01); *C01B 32/50* (2017.08); *C01B 2210/005* (2013.01); *C01B 2210/0034* (2013.01); *C01B 2210/0045* (2013.01); *C01B 2210/0053* (2013.01)

(58) Field of Classification Search
  CPC ...... C01B 2210/0045; C01B 2210/005; C01B 2210/0053; C01B 23/0094; C01B 2210/0004; C01B 2210/0006; C01B 2210/0014; C30B 29/06; B01D 53/02; B01D 2257/504
  See application file for complete search history.

(56) References Cited

FOREIGN PATENT DOCUMENTS

| | | | |
|---|---|---|---|
| JP | 2011-184287 A | | 9/2011 |
| JP | 2011184287 A | * | 9/2011 |
| JP | 2012-106904 A | | 6/2012 |
| JP | 2012-229151 A | | 11/2012 |
| JP | 2012229151 A | * | 11/2012 |
| JP | 2013-155091 A | | 8/2013 |
| JP | 2014-034493 A | | 2/2014 |
| JP | 2014034493 A | * | 2/2014 |

OTHER PUBLICATIONS

Jul. 31, 2019 Office Action issued in Chinese Application No. 201680016958.7.
Mar. 4, 2020 Office Action issued in Chinese Patent Application No. 201680016958.7.

* cited by examiner

METHOD FOR REFINING ARGON GAS AND RECOVERING AND REFINING APPARATUS FOR ARGON GAS

TECHNICAL FIELD

The present invention relates to a method for refining an argon gas which contains very small amounts of hydrogen, oxygen, and carbon monoxide as impurities, and a recovering and refining apparatus for an argon gas.

BACKGROUND ART

In a silicon single crystal manufacturing apparatus used for manufacture of a silicon single crystal by a CZ (Czochralski) method or an FZ (Floating zone) method, an argon gas is used as a furnace atmospheric gas. The argon gas is a gas which is contained in air in small amounts, and also a gas which is more expensive than gases such as oxygen or nitrogen. Thus, an equipment to recover, refine, and reuse the argon gas discharged from the apparatus (which will be referred to as a waste argon gas hereinafter) has been devised (Patent Literature 1, Patent Literature 2).

In manufacture of single-crystal silicon, to improve quality, a high-purity argon gas is used, but purity of the waste argon gas from the silicon single crystal manufacturing apparatus is lowered due to mixing of hydrogen, oxygen, carbon monoxide, nitrogen, or the like, and the waste argon gas cannot be reused as it is. Thus, it must be refined, and various refining methods have been proposed (Patent Literature 1, Patent Literature 2).

In refinement of impurities in the argon gas, a general method is carried out by an impurity adsorbing method using an adsorbent such as zeolite, but the impurities such as hydrogen, oxygen, carbon monoxide, and the like are hardly adsorbed. Thus, hydrogen or oxygen is added in a previous step of an adsorption process to cause a reaction by using a platinum catalyst or the like, and thereby the hydrogen, the oxygen, or the carbon monoxide is converted into a material which can be readily adsorbed by the adsorbent, e.g., water and carbon dioxide.

In a conversion process to add the hydrogen and oxygen to the hydrogen, the oxygen, and the carbon monoxide contained in the waste argon gas and to thereby convert them into the water and the carbon dioxide by a catalytic reaction, it is considered that the catalytic reaction based on the following chemical formula is carried out on a surface of the catalyst.

$$H_2 + (\tfrac{1}{2})O_2 \rightarrow H_2O \quad (1)$$

$$CO + (\tfrac{1}{2})O_2 \rightarrow CO_2 \quad (2)$$

To convert all of the hydrogen, the oxygen, and the carbon monoxide contained in the waste argon gas into the water and the carbon dioxide by this reaction so that the hydrogen, the oxygen, and the carbon monoxide do not remain in subsequent steps of the catalytic reaction process, it is necessary to add exact amounts of the hydrogen and the oxygen in accordance with stoichiometric ratios in this chemical formula.

However, the amounts of the hydrogen, the oxygen, and the carbon monoxide in the waste argon gas discharged from the silicon single crystal manufacturing apparatus constantly fluctuate, and it is very difficult to adjust additive amounts of the hydrogen and the oxygen in correspondence with the fluctuating amounts. Thus, there is generally used a method for adding excessively larger amounts of hydrogen and oxygen than previously assumed amounts of the hydrogen, the oxygen, and the carbon monoxide contained in the waste argon gas to carry out the catalytic reaction and then removing surplus hydrogen or surplus oxygen which remains after the catalytic reaction by another method.

Patent Literature 1 describes a method for adding excess hydrogen to a waste argon gas which contains hydrogen, oxygen, and carbon monoxide as impurities, effecting a catalytic reaction of converting the oxygen into water, and then converting surplus hydrogen and surplus carbon monoxide into water and carbon dioxide with the use of copper oxide by the following reaction at a temperature of 320° C.

$$H_2 + CuO \rightarrow H_2O + Cu \quad (3)$$

$$CO + CuO \rightarrow CO_2 + Cu \quad (4)$$

Patent Literature 2 describes a method for adding excess hydrogen to a waste argon gas which contains hydrogen, oxygen, and carbon monoxide as impurities, converting the hydrogen and the carbon monoxide into water and carbon dioxide by a catalytic reaction, and then removing surplus oxygen by the following reaction using a metal at a temperature of 250° C.

$$O_2 + \text{Metal} \rightarrow \text{Metal oxide} \quad (5)$$

CITATION LIST

Patent Literatures

Patent Literature 1: Japanese Unexamined Patent Publication (Kokai) No. Sho 62-119104

Patent Literature 2: Japanese Unexamined Patent Publication (Kokai) No. 2012-229151

DISCLOSURE OF INVENTION

Problem to be Solved by the Invention

As a high-purity argon gas which is used as a furnace atmospheric gas in a silicon single crystal manufacturing apparatus, a high-purity argon gas which has hydrogen concentration of approximately 1 mole ppm or less, oxygen concentration of approximately 1 mole ppm or less, and carbon monoxide concentration of approximately 1 mole ppm or less is used. As a matter of course, in case of recovering, refining, and reusing a waste argon gas to be discharged, impurities must be refined and removed so that the purity of this level can be achieved.

However, according to actual achievement of manufacture of silicon single crystals performed by the present inventors, in the silicon single crystal manufacturing apparatus, the concentration of each of the hydrogen, the oxygen, and the carbon monoxide is approximately several mole ppm to 100 mole ppm, and such concentration fluctuates in the range of several tens of mole ppm.

Thus, for example, assuming that concentration of hydrogen contained in a waste argon gas having a flow volume of 500 Nm³/h is 100 mole ppm and the concentration of the hydrogen in the argon gas is approximately zero (1 mole ppm or less) after refinement, to convert 100% of this hydrogen into water by a catalytic reaction based on addition of oxygen, the following additive amount (A) of the oxygen is required based on the Expression (1).

$$A = 500 \text{ Nm}^3/h \times 100 \text{ mole ppm} \times \tfrac{1}{2} = 0.025 \text{ Nm}^3/h = 0.417 \text{ NL/min}$$

Further, an additive amount (B) of oxygen to convert 100% of the hydrogen of 1 mole ppm into water is calculated as follows.

$$B=500 \text{ Nm}^3/h \times 1 \text{ mole ppm} \times \frac{1}{2} = 0.00417 \text{ NL/min}$$

This means that, to set the oxygen concentration after the catalytic reaction to 1 mole ppm or less, an amount of the oxygen to be added must be constantly controlled in just proportion, with an accuracy of 0.00417 NL/min or less, to a fluctuation in hydrogen concentration in the waste argon gas. This is technically very difficult.

Figure 6:
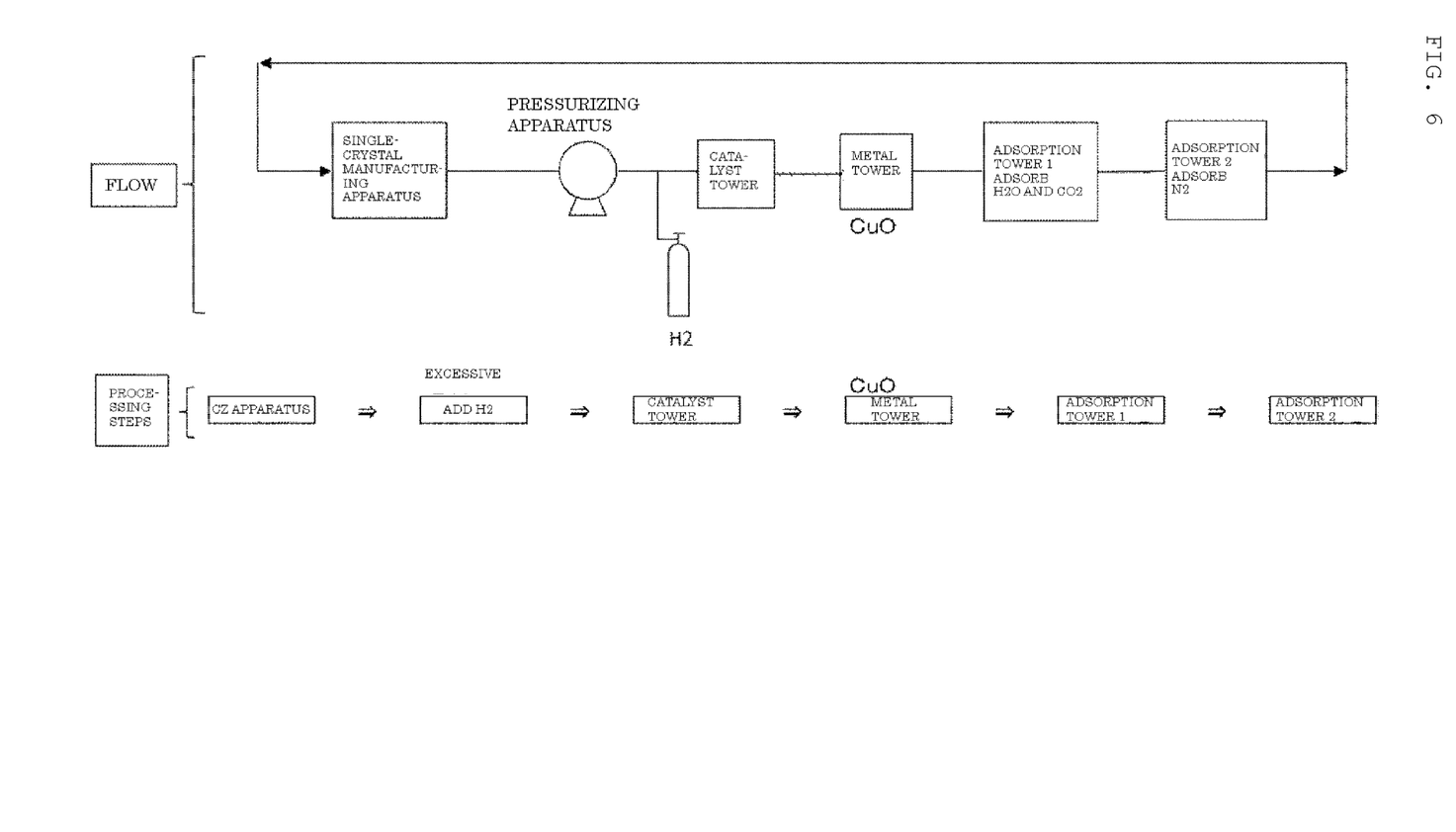
FIG. 6 is a schematic view showing an example of a refining flow of the waste argon gas from the silicon single crystal manufacturing apparatus according to a conventional technology (Patent Literature 1)
Figure 7:
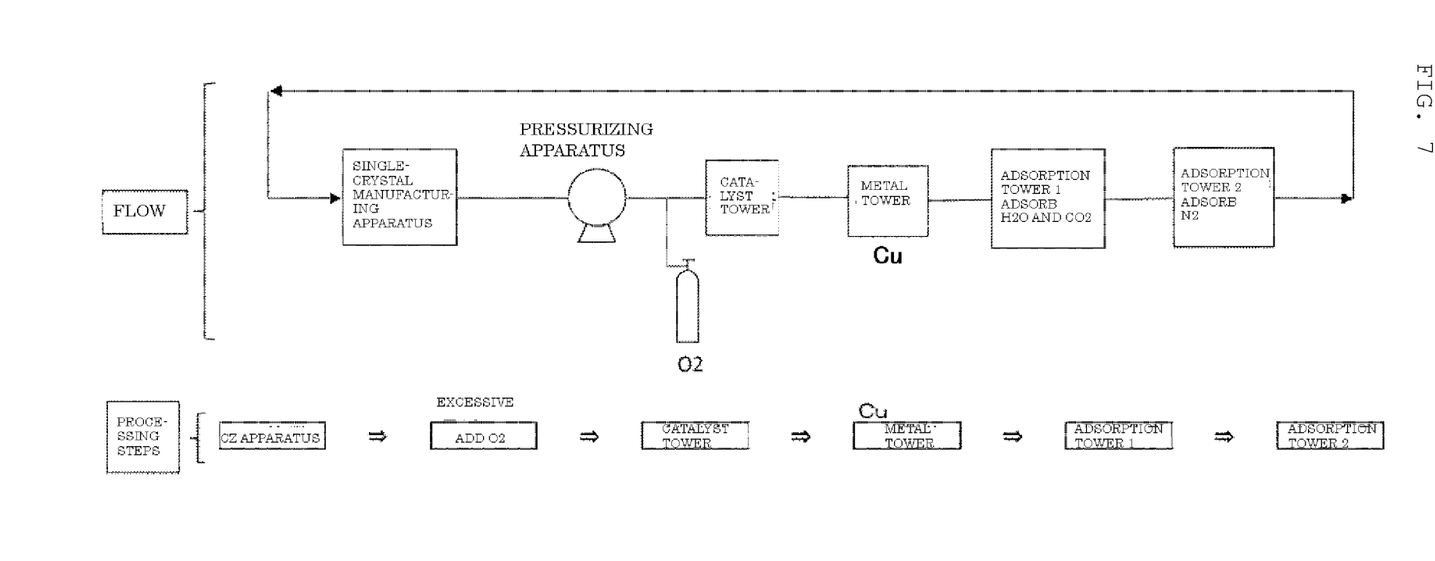
FIG. 7 is a schematic view showing an example of a refining flow of the waste argon gas from the silicon single crystal manufacturing apparatus according to a conventional technology (Patent Literature 2).

Thus, in the refinement of a waste argon gas, there has been devised a removing method, which not only uses the catalytic reaction of gases contained in the waste argon gas and an added gas, but also remove a surplus gas after a catalytic reaction by using an oxidized metal or a reduced metal. When the surplus gases are hydrogen and carbon monoxide, the oxidized metal is prepared on a downstream side of a catalyst tower as shown in FIG. 6, and the hydrogen and the carbon monoxide are oxidized and converted into water and carbon dioxide by oxygen coupled with the metal (see Patent Literature 1). When the surplus gas is the oxygen, there is adopted a method for preparing the reduced metal as shown in FIG. 7 to generate an oxidized metal and thereby removing oxygen (see Patent Literature 2). FIG. 6 shows an example where the oxidized metal is CuO, and FIG. 7 shows an example where the reduced metal is Cu.

However, according to this method using the metals, since a reaction at a high temperature of 250° C. or more must be caused, an electric heater is generally used, but it is a disadvantageous method in terms of energy. Further, during an operation of the refining apparatus, an operation to regenerate metals is required. For example, in case of converting the hydrogen into water by using the oxidized metal, when all metals in a tower (which will be referred to as a metal tower hereinafter) are reduced, they do not effectively work any further, and hence they must be again converted into oxidized metals by a regenerating operation (introduction of oxygen and a high-temperature reaction). Thus, an equipment for the regeneration is required, which can be a factor of an increase in equipment cost.

Further, in the case that water generation from the hydrogen is carried out with the use of, e.g., an oxidized metal, when the oxygen exceeding assumed oxygen concentration is mixed in the waste argon gas in the silicon single crystal manufacturing apparatus in a state where the reaction has advanced and many reduced metals are present in the metal tower, an oxidative reaction of the reduced metals suddenly occurs in some situations. In this case, since a large amount of reaction heat is discharged, the inside of the metal tower has an extremely high temperature, which may possibly lead to a failure of the metal tower. Therefore, excess oxygen must be constantly controlled to be prevented from mixing, thus resulting in a further increase in apparatus cost.

In view of the problem, it is an object of the present invention to provide a method for refining an argon gas and a recovering and refining apparatus for an argon gas which can supply oxygen and hydrogen in just proportion even in a case where amounts of impurities contained in an argon gas fluctuate by adding the oxygen and the hydrogen to the argon gas which contains at least one of hydrogen, carbon monoxide, and oxygen as impurities, no longer require a metal tower to remove surplus oxygen or hydrogen, have a low equipment cost, and hardly fail to operate properly.

Means for Solving Problem

To achieve the object, the present invention provides a method for refining an argon gas, in which oxygen is added to the argon gas containing at least one of hydrogen, carbon monoxide, and oxygen as impurities so that the hydrogen and the carbon monoxide contained in the argon gas are converted into water and carbon dioxide by using a catalytic reaction in a catalyst tower, or hydrogen is added to the argon gas so that the oxygen contained in the argon gas is converted into the water by using a catalyst reaction in the catalyst tower, and at least one of the hydrogen, the carbon monoxide, and the oxygen is thereby removed from the argon gas, the method comprising the steps of:

monitoring at least one of the hydrogen, the carbon monoxide, and the oxygen on an outlet side of the catalyst tower; and at least one of adding the oxygen to the argon gas on an inlet side of the catalyst tower when any one of the hydrogen and the carbon monoxide is detected on the outlet side of the catalyst tower, and adding the hydrogen to the argon gas on the inlet side of the catalyst tower when the oxygen is detected on the outlet side of the catalyst tower, wherein the oxygen or the hydrogen to be added is intermittently added to the catalyst tower relative to continuous supply of the argon gas to the catalyst tower, and at least one of the hydrogen, the carbon monoxide, and the oxygen contained in the argon gas is thereby removed.

As described above, when at least one of the hydrogen, the carbon monoxide, and the oxygen is monitored and the oxygen and the hydrogen are intermittently added, the oxygen and the hydrogen can be supplied in just proportion even if amounts of these impurities contained in the argon gas fluctuate, and the argon gas can be continuously refined.

As this time, it is preferable that the method comprises none of the steps of, on a downstream side of the catalyst tower, removing oxygen, which is surplus due to the catalytic reaction, by an oxidative reaction with a metal, and removing hydrogen, which is surplus due to the catalytic reaction, by a reductive reaction with a metal.

As described above, when the removal of the surplus oxygen by the oxidative reaction with the metal and the removal of the surplus hydrogen by the reductive reaction with the metal are not provided, the metal tower on the downstream side of the catalyst tower is no longer necessary, the equipment structure becomes simple, the equipment cost can be reduced, regeneration of the metal in the metal tower by the oxidation or reduction is no longer required, and occurrence of an equipment failure due to the metal tower can be eliminated. Furthermore, energy consumption can be also reduced.

At this time, it is preferable that a total amount of the hydrogen and the carbon monoxide contained in the argon gas to be refined is compared with an amount of the oxygen contained in the argon gas to be refined, a gas to be added is the oxygen when the total amount of the hydrogen and the carbon monoxide exceeds a double of the amount of the oxygen in terms of a mole equivalent ratio, and a gas to be added is the hydrogen when the same is less than the double.

As described above, comparing the total amount of the hydrogen and the carbon monoxide contained in the argon gas to be refined with the amount of the oxygen enables determining which one of the oxygen and the hydrogen is used as a gas to be added in advance, and hence the argon gas can be refined by the refining apparatus having only one type of catalyst tower.

At this time, it is preferable that the argon gas to be refined is a waste argon gas which is discharged from a silicon single crystal manufacturing apparatus.

In this manner, when the waste argon gas discharged from the silicon single crystal manufacturing apparatus is refined by the method, an operating cost of the silicon single crystal manufacturing apparatus can be suppressed low.

At this time, it is preferable that an amount of the oxygen or the hydrogen which is intermittently added is equalized with a stoichiometric amount of oxygen or hydrogen which is insufficient due to the catalytic reaction during a time when the oxygen and the hydrogen are not added.

As described above, the stoichiometric amount of the hydrogen or the oxygen which is insufficient due to the catalytic reaction is added, the surplus oxygen and hydrogen can be prevented from being produced.

Moreover, to achieve the object, according to the present invention, there is provided a recovering and refining apparatus for an argon gas which contains at least one of hydrogen, carbon monoxide, and oxygen as impurities, comprising:

at least one of a catalyst tower in which oxygen is added to the argon gas so that the hydrogen and the carbon monoxide contained in the argon gas are converted into water and carbon dioxide by a catalytic reaction, and a catalyst tower in which hydrogen is added to the argon gas so that the oxygen contained in the argon gas is converted into the water by a catalytic reaction;

detecting means for monitoring at least one of the hydrogen, the carbon monoxide, and the oxygen on an outlet side of the catalyst tower; and at least one of oxygen adding means for adding the oxygen to the argon gas on an inlet side of the catalyst tower when any one of the hydrogen and the carbon monoxide is detected on the outlet side of the catalyst tower, and hydrogen adding means for adding the hydrogen to the argon gas on the inlet side of the catalyst tower when the oxygen is detected on the outlet side of the catalyst tower, wherein the oxygen adding means and the hydrogen adding means intermittently add the oxygen or the hydrogen relative to continuous supply of the argon gas to the catalyst tower.

As described above, when the oxygen and the hydrogen are intermittently added by the oxygen adding means and the hydrogen adding means respectively, the oxygen and the hydrogen can be supplied in just proportion even if amounts of the impurities contained in the argon gas fluctuate, and the argon gas can be continuously refined.

At this time, it is preferable that the apparatus comprises none of, on a downstream side of the catalyst tower, a metal tower in which oxygen which is surplus due to the catalytic reaction is removed by an oxidative reaction with a metal, and a metal tower in which hydrogen which is surplus due to the catalytic reaction is removed by a reductive reaction with a metal.

As described above, according to the recovering and refining apparatus for an argon gas which does not have the metal tower, the equipment structure becomes simple, the equipment cost can be reduced, regeneration of the metal in the metal tower by oxidation or reduction is no longer required, and occurrence of an equipment failure due to the metal tower can be eliminated. Furthermore, energy consumption can be also reduced.

At this time, it is preferable that a total amount of the hydrogen and the carbon monoxide contained in the argon gas to be refined is compared with an amount of the oxygen contained in the argon gas to be refined, the oxygen is added when the total amount of the hydrogen and the carbon monoxide exceeds a double of the amount of the oxygen in terms of a mole equivalent ratio, and the hydrogen is added when the same is less than the double.

As described above, since comparing the total amount of the hydrogen and the carbon monoxide contained in the argon gas to be refined with the amount of the oxygen enables determining which one of the oxygen and the hydrogen is used as a gas to be added in advance, and hence the recovering and refining apparatus for an argon gas which has only one type of catalyst tower can be provided.

At this time, it is preferable that the argon gas to be refined is a waste argon gas discharged from a silicon single crystal manufacturing apparatus.

As described above, when the waste argon gas discharged from the silicon single crystal manufacturing apparatus is refined by the recovering and refining apparatus for an argon gas, an operating cost of the silicon single crystal manufacturing apparatus can be suppressed low.

At this time, it is preferable that an amount of the oxygen or the hydrogen which is intermittently added is equalized with a stoichiometric amount of oxygen or hydrogen which is insufficient due to the catalytic reaction during a time when the oxygen and the hydrogen are not added.

As described above, when the stoichiometric amount of the hydrogen or the oxygen which is insufficient due to the catalytic reaction is added, the surplus oxygen and hydrogen can be prevented from being produced.

Effect of the Invention

As described above, according to the present invention in case of refining the argon gas containing very small amounts of the hydrogen, the oxygen, and the carbon monoxide as impurities, intermittently adding the hydrogen and the oxygen enables eliminating the removal equipment which is installed on the downstream side of the catalyst tower and processes the surplus hydrogen and the surplus oxygen, and reducing a cost of the recovering and refining apparatus for an argon gas, stably operating the apparatus, and decreasing the energy consumption.

BEST MODE(S) FOR CARRYING OUT THE INVENTION

As described above, a recovering and refining apparatus for an argon gas and a method for refining an argon gas which realize a low apparatus cost, a stable operation, and a low energy cost have been demanded.

In refinement of a waste argon gas from a silicon single crystal manufacturing apparatus or the like, the present inventors have paid attention to the point that there is a time lag between amounts of added hydrogen and oxygen and amounts of surplus hydrogen and surplus oxygen flowing from a catalyst tower when the hydrogen and the oxygen are added to the hydrogen, the oxygen, and carbon monoxide in the waste argon gas to cause a catalytic reaction.

For example, it has been revealed that, in a case where hydrogen concentration on an inlet side of the catalyst tower is constant, when an oxygen flow volume to be added is first maintained constant and then the added oxygen flow volume is suddenly increased to a stoichiometric ratio or more, there is a time lag of several minutes to several tens of minutes after the increase in oxygen flow volume at the inlet until surplus oxygen appears on an outlet side of the catalyst tower.

Further, it has been also revealed that, in a case where oxygen concentration on the inlet side of the catalyst tower is constant and hydrogen is added, there is likewise a time lag of several minutes to several tens of minutes after starting excessive addition of the hydrogen until the hydrogen appears on the outlet side of the catalyst tower. This leads to a supposition that the catalyst tower has an oxygen and hydrogen retaining function.

As a result of conducting the earnest examinations to achieve the objects, the present inventors have found out that a metal tower adopted in conventional examples can be eliminated by applying the oxygen and hydrogen retaining function of a catalyst to intermittently add the oxygen and the hydrogen to the catalyst tower, and brought the present invention to completion. That is, the present invention eliminates a metal tower provided, on a post stage of the catalyst tower, which removes the surplus hydrogen or the surplus oxygen, and enables a reduction in equipment cost, energy saving, and a decrease in frequency of occurrence of apparatus failures.

An embodiment of the present invention will now be described in detail hereinafter with reference to the drawings, but the present invention is not restricted thereto.

[Recovering and Refining Apparatus for Argon Gas]

A recovering and refining apparatus for an argon gas will now be described hereinafter with reference to FIG. 1 to FIG. 5.

Figure 1:
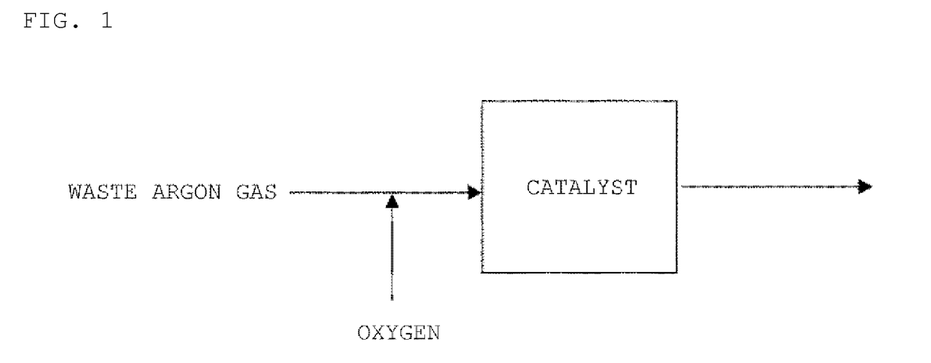
FIG. 1 is a schematic view showing that oxygen is added to a waste argon gas to cause a catalytic reaction.

FIG. 1 is a schematic view showing that oxygen is added to a waste argon gas to cause a catalytic reaction, and it is a view when the oxygen is added or injected on an inlet side of a catalyst tower. The waste argon gas contains at least one of hydrogen, carbon monoxide, and oxygen as an impurity. In this case, when the oxygen is intermittently added or injected, the added oxygen must be sufficiently uniformly mixed in the waste argon gas by the time that it reaches a surface of a catalyst.

Figure 2:
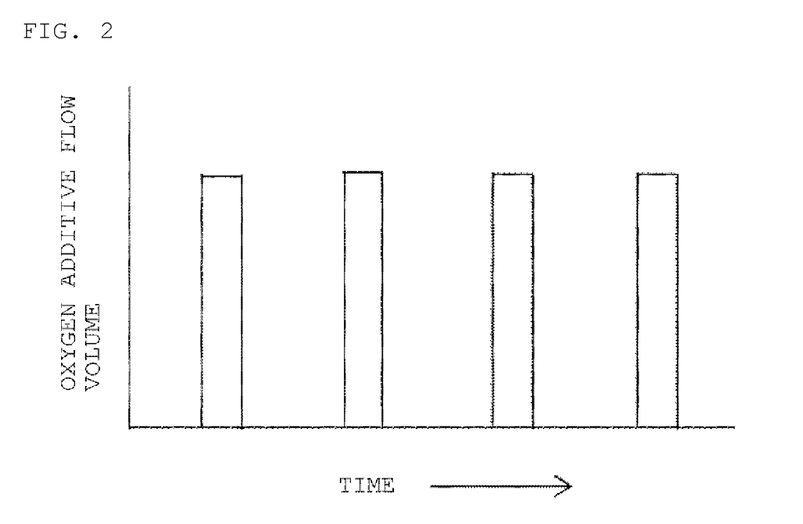
FIG. 2 is a schematic view of an oxygen additive flow volume when the oxygen is intermittently added by a method for refining an argon gas according to the present invention.

FIG. 2 is a schematic view of oxygen additive flow volumes when the oxygen is intermittently added according to the present invention. The additive flow volume must be an amount which is greatly beyond a stoichiometric ratio and falls below an oxygen retaining amount of the catalyst so that the oxygen does not flow to a downstream side of the catalyst tower. Thus, a relationship between an amount of the catalyst and an oxygen retainable amount of the catalyst must be checked by conducting a test in advance. When the amount of the catalyst is too small, an oxidative reaction becomes insufficient or oxygen addition intervals are too short and unrealistic in some cases, and hence attention is required.

Figure 3:
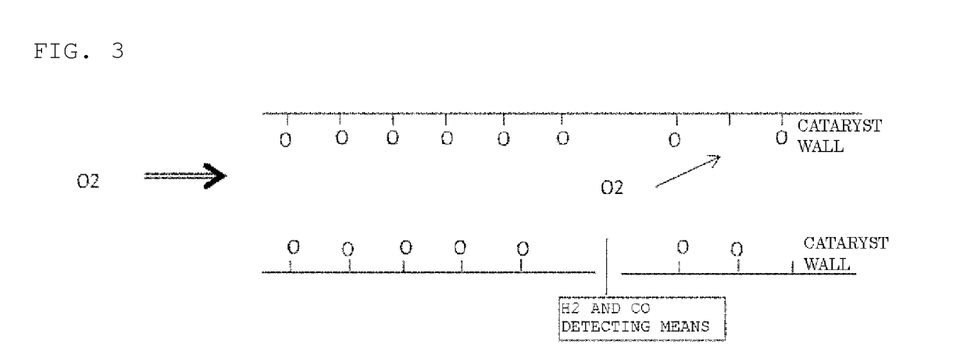
FIG. 3 is a schematic view showing an oxygen retaining function on a catalyst surface.

FIG. 3 is a schematic view showing an image of the oxygen retaining function on a catalyst surface, which is assumed by the present inventors. Since how the oxygen is retained on the catalyst surface is unknown, the retained oxygen is tentatively represented by a symbol "O". An amount of the oxygen to be intermittently added or injected must not exceed an amount of the oxygen which can be retained on the catalyst surface. Furthermore, when a hydrogen densitometer and a carbon monoxide densitometer (detecting means) to monitor surplus (unreacted) hydrogen and surplus (unreacted) carbon monoxide which appear on an outlet side of the catalyst tower are installed in the middle of the catalyst tower or when the catalyst towers are installed on two stages and these densitometers are installed between them, it is possible to cope with leakage of a hydrogen component from the catalyst tower or delay times of the densitometers on the outlet side of the catalyst tower.

Figure 4:
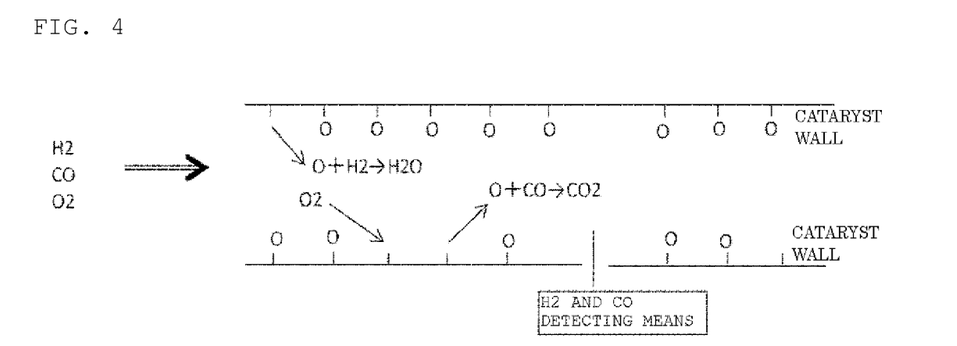
FIG. 4 is a schematic view showing that the oxygen retained on the catalyst surface reacts with hydrogen and carbon monoxide in the argon gas to be converted into water and carbon dioxide.

FIG. 4 is a schematic view showing an image of a reaction of the oxygen retained on the catalyst surface and the hydrogen and the carbon monoxide in the argon gas when the hydrogen, the carbon monoxide, and the oxygen are contained in the argon gas, which is assumed by the present inventors. The oxygen present in the argon gas in advance is temporarily retained on the catalyst surface. Additionally, like the oxygen already retained on the catalyst surface, it reacts with the hydrogen and the carbon monoxide in the argon gas, and water and carbon dioxide are thereby generated.

It is to be noted that the description using FIG. 3 and FIG. 4 expresses the assumption of the present inventors to explain a phenomenon which occurs in the catalyst tower in an easy-to-understand manner. Whether this assumption is right or wrong does not affect the effectiveness of the present invention.

Further, when this state continues, the oxygen retained on the catalyst surface is all consumed by the reaction, the oxygen becomes insufficient, and unreacted hydrogen and unreacted carbon monoxide appear on an outlet side of the catalyst tower. In such a state, the oxygen is again intermittently added or injected so that the oxygen is retained on the catalyst surface. This operation is repeatedly performed.

Figure 5:
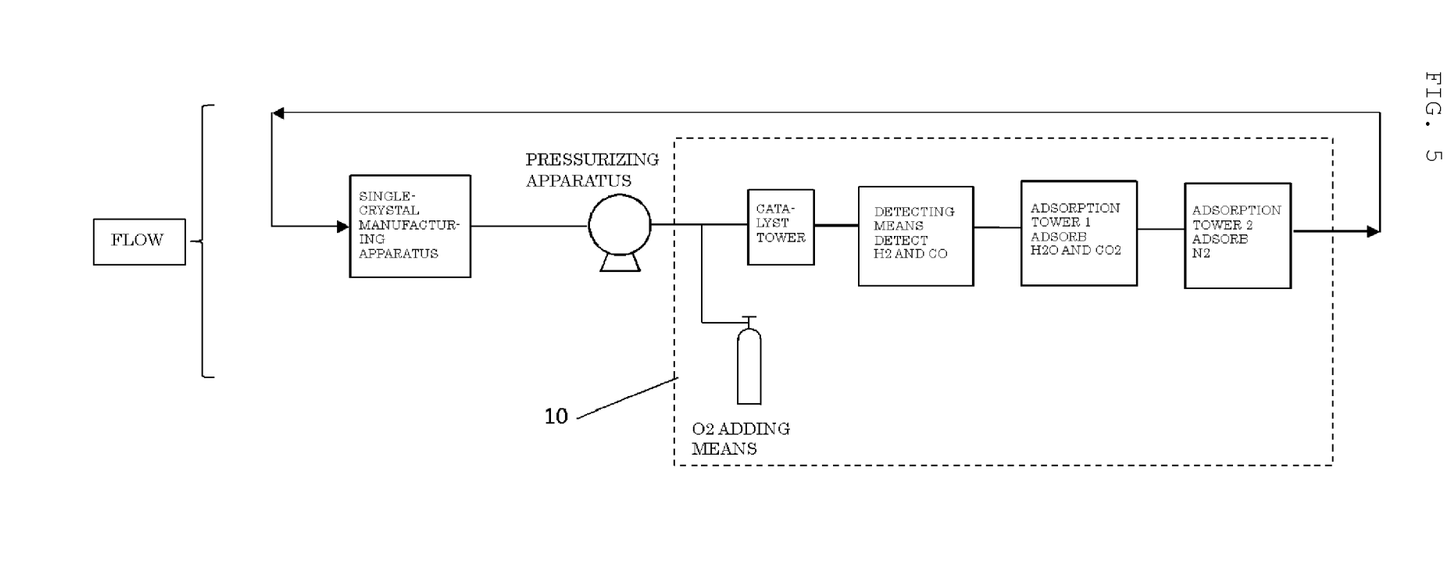
FIG. 5 is a schematic view showing an example of a refining flow of the waste argon gas from a silicon single crystal manufacturing apparatus according to the present invention.

FIG. 5 is a schematic view showing an example of a refining flow of the waste argon gas from a silicon single crystal manufacturing apparatus, and a metal tower, which is present in a recovering and refining apparatus for an argon gas according to conventional technologies (FIG. 6 and FIG. 7), on a downstream side of the catalyst tower is not required. In FIG. 5, a part surrounded by a broken line corresponds to the recovering and refining apparatus for the waste argon gas. The waste argon gas discharged from the single-crystal manufacturing apparatus is pressurized to a predetermined pressure by a pressurizing apparatus, and then supplied to the recovering and refining apparatus 10 for the waste argon gas. The recovering and refining apparatus for the waste argon gas according to the present invention has at least one of the catalyst tower where oxygen is added to the argon gas so that the hydrogen and the carbon monoxide contained in the argon gas are converted into the water and the carbon dioxide by the catalytic reaction, and the catalyst tower where hydrogen is added to the argon gas so that the oxygen contained in the argon gas is converted into the water by the catalytic reaction. However, FIG. 5 shows an example where the apparatus has only the catalyst tower where oxygen is added to the hydrogen and the carbon monoxide to convert them into the water and the carbon dioxide.

The recovering and refining apparatus for the waste argon gas according to the present invention is provided with detecting means for monitoring at least one of the hydrogen, the carbon monoxide, and the oxygen on an outlet side of the catalyst tower. A recovering and refining apparatus 10 for a waste argon gas shown in FIG. 5 is provided with detecting means for the hydrogen and the carbon monoxide.

Further, the recovering and refining apparatus for the waste argon gas according to the present invention includes at least one of oxygen adding means for adding the oxygen to the argon gas on an inlet side of the catalyst tower when one of the hydrogen and the carbon monoxide is detected on the outlet side of the catalyst tower, and hydrogen adding means for adding the hydrogen to the argon gas on the inlet side of the catalyst tower when the oxygen is detected on the outlet side of the catalyst tower. There is shown an example where the recovering and refining apparatus 10 for the waste argon gas in FIG. 5 includes the oxygen adding means.

When either the hydrogen or the carbon monoxide is detected by the detecting means, a predetermined large flow volume of the oxygen is immediately added into the catalyst tower for a short time by the oxygen adding means. Consequently, the oxygen is again retained by the catalyst in the catalyst tower.

As an adsorption tower installed at the rear of this catalyst tower, one which can adsorb and remove the water and the carbon dioxide generated by the catalyst tower, and nitrogen can suffice, and the same adsorption tower as those in conventional examples may be used, or any other type may be used. In the example of the recovering and refining apparatus for an argon gas according to the present invention shown in FIG. 5, like the conventional techniques shown in FIG. 6 and FIG. 7, the water and the carbon dioxide are adsorbed and removed in a first adsorption tower, and the nitrogen is adsorbed in a second adsorption tower. As adsorbents for the water and the carbon dioxide, and the nitrogen, for example, zeolite and mordenite type zeolite are disclosed, respectively, in Patent Literature 1, and these materials can be used.

The modes described above all correspond to a case where an impurity amount in the waste argon gas stoichiometrically meets (a total amount of the hydrogen and the carbon monoxide)>(an amount of the oxygen), adding the oxygen alone before the catalyst tower can suffice, and this is an example where hydrogen adding means is not provided. According to a result of a test conducted by the present inventors, since a hydrogen retaining function on the catalyst surface is also present like the case of the oxygen, when the impurity amount in the waste argon gas stoichiometrically meets (the total amount of the hydrogen+the carbon monoxide)<(the amount of the oxygen), the gas to be added or injected is changed to the hydrogen, and the same apparatus structure can be adopted. A difference from the recovering and refining apparatus 10 for an argon gas shown in FIG. 5 lies in that the hydrogen adding means is provided in place of the oxygen adding means and the gas to be detected is the oxygen.

It is to be noted that, in case of using an mole equivalent, it can be said that the oxygen is added by the oxygen adding means when the total amount of the hydrogen and the carbon monoxide in the waste argon gas exceeds a double of the amount of the oxygen in a mole equivalent ratio, or that the hydrogen is added by the hydrogen adding means when the same is less than the double.

Furthermore, when concentration of the impurities in the waste argon gas fluctuates with time and the gas to be added must be changed, it is preferable to include both the oxygen adding means and the hydrogen adding means.

In the recovering and refining apparatus for the waste argon gas according to the present invention, the same amount of the oxygen or the hydrogen, as a stoichiometric amount of the oxygen or the hydrogen which lacks due to the catalytic reaction in the catalyst tower during a time when the oxygen or the hydrogen is not added, is added, and hence the surplus oxygen or hydrogen can be prevented from being produced.

[Refining Method for Argon Gas]

A method for refining an argon gas using the recovering and refining apparatus for an argon gas shown in FIG. 5 will now be described hereinafter.

First, in such refinement of the waste argon gas as shown in FIG. 1, in case of converting the hydrogen and the carbon monoxide into the water and the carbon dioxide by additive oxygen with the use of the catalyst tower, the additive oxygen is added or injected excessively for a stoichiometric ratio in a short time (in terms of a peak), and the oxygen is thereby retained in the catalyst tower. On the outlet side of the catalyst tower, the hydrogen and the carbon monoxide are continuously monitored. Then, the hydrogen and the carbon monoxide react with the oxygen held in the catalyst tower and thus the water and the carbon dioxide are generated until the hydrogen or the carbon monoxide appears on the outlet side of the catalyst tower. Moreover, when the hydrogen or the carbon monoxide is detected on the outlet side of the catalyst tower, an operation to inject (add) the oxygen which is excessive for the stoichiometric ratio is again performed. This situation means that the stoichiometric amount of the oxygen is added as a whole by intermittently injecting the excessive oxygen for a short time as shown in FIG. 2, and the refinement of the waste argon gas can be continuously advanced.

Additionally, when the concentrations of the hydrogen and the carbon monoxide contained in the waste argon gas have changed, intervals of short-time injection alone are changed as a consequence. Namely, time intervals of appearance of the hydrogen and the carbon monoxide on the outlet side of the catalyst tower are shortened when the concentrations of the hydrogen and the carbon monoxide are increased, or the time intervals of appearance of the hydrogen and the carbon monoxide on the outlet side of the catalyst tower are just prolonged when the concentrations are lowered. Therefore, troublesome adjustment concerning an additive amount of the oxygen does not have to be carried out, and automatic control can be simply realized.

As to the oxygen contained in the waste argon gas, when the addition of the oxygen is changed to the addition of the hydrogen and the appearance of the oxygen is monitored, the same refining method can be applied.

As described above, in a case where gases to be removed are the hydrogen, the carbon monoxide, and the oxygen, since two types of gases are added, the catalysts must be independently provided on two stages (a catalyst to remove the hydrogen and the carbon monoxide and a catalyst to remove the oxygen) if concentrations of the gases to be removed greatly change. However, in case of the waste argon gas from the normal silicon single crystal manufacturing apparatus, it is often the case that a magnitude correlation of a total amount of the hydrogen and the carbon monoxide and an amount of oxygen is fixed, a smaller amount gas is used by a larger amount gas for the catalytic reaction, and hence installing either the oxygen adding means or the hydrogen adding means can usually suffice.

EXAMPLES

Although the present invention will now be more specifically described hereinafter with reference to examples, but the present invention is not restricted thereto.

Examples

A waste argon gas from a silicon single crystal manufacturing apparatus (a CZ apparatus) was refined by a recovering and refining apparatus for an argon gas and a method for refining an argon gas according to the present invention (based on the refining flow shown in FIG. 5.).

Apparatus operating conditions of the recovering and refining apparatus 10 for an argon gas are as described below.
  Waste argon gas flow volume: 500 $Nm^3/h$
  Impurity concentrations in the waste argon gas
    Hydrogen: 5 to 20 mole ppm
    Oxygen: 20 to 30 mole ppm
    Carbon monoxide: 60 to 100 mole ppm
    Nitrogen: 50 to 100 mole ppm
  It is to be noted that this waste argon gas constantly stoichiometrically met (a total amount of the hydrogen and the carbon monoxide)>(an amount of the oxygen).
  Catalyst: Pt catalyst
  Added gas: Oxygen (4 NL of oxygen was injected per one intermittent injection)

An intermittent injection amount of 4 NL was obtained by actually measuring a holding capability of the catalyst in advance.

Table 1 shows values obtained by converting respective concentrations, i.e., minimum (Min) values, average (Ave) values, and maximum (Max) values of the concentrations of the impurities (the hydrogen, the oxygen, and the carbon monoxide) in the waste argon gas into flow volumes by a calculation, and results of obtaining intermittent addition intervals with the use of these values. Further, impurity flow volumes and intermittent addition intervals when a waste argon gas flow volume is 487 $Nm^3/h$, hydrogen concentration is 7 mole ppm, oxygen concentration is 23 mole ppm, and carbon monoxide concentration is 65 mole ppm (Example 1) and when a waste argon gas flow volume is 498 $Nm^3/h$, hydrogen concentration is 3 mole ppm, oxygen concentration is 27 mole ppm, and carbon monoxide concentration is 95 mole ppm (Example 2) were also obtained by a calculation, and results are shown in Table 1.

TABLE 1

| | | Range of operating conditions | | | Examples | |
|---|---|---|---|---|---|---|
| | Unit | Min | Ave | Max | Example 1 | Example 2 |
| Waste argon gas flow volume | Nm3/hr | 500 | 500 | 500 | 487 | 498 |
| Hydrogen concentration | Mole ppm | 5 | 10 | 20 | 7 | 3 |
| Oxygen concentration | Mole ppm | 20 | 25 | 30 | 23 | 27 |
| Carbon monoxide concentration | Mole ppm | 60 | 80 | 100 | 65 | 95 |
| Difference in waste argon gas | Mole ppm | 25 | 40 | 60 | 26 | 44 |
| Intermittent oxygen injection amount | NL | 4.0 | 4.0 | 4.0 | 4.0 | 4.0 |
| Hydrogen flow volume | NL/min | 0.04167 | 0.08333 | 0.16667 | 0.05682 | 0.02490 |
| Oxygen flow volume | NL/min | 0.16667 | 0.20833 | 0.25000 | 0.18668 | 0.22410 |
| Carbon monoxide flow volume | NL/min | 0.50000 | 0.66667 | 0.83333 | 0.52758 | 0.78850 |
| Intermittent addition interval | min | 38.4 | 24.0 | 16.0 | 37.9 | 21.9 |
| Difference after catalytic reaction | NL | 0.000 | 0.000 | 0.000 | 0.000 | 0.000 |

The calculated values in Table 1 will now be described with reference to a column of the minimum values (Min) of the concentrations as an example.

Since the concentration of the hydrogen is 5 mole ppm, the flow volume of the same is 0.04167 NL/min (=500 $Nm^3/h \times 5$ mole ppm=0.0025 $Nm^3/h$=0.04167 NL/min).

Based on the same calculation, the flow volume of the oxygen is 0.16667 NL/min since the concentration of the same is 20 mole ppm, and the flow volume of the carbon monoxide is 0.50000 NL/min since the concentration of the same is 60 mole ppm.

The "difference in waste argon gas" shown in Table 1 represents concentrations of gases which remain as a result of the catalytic reaction in the catalytic tower when no gas is added. The hydrogen and the carbon monoxide can be treated in terms of a total amount without being discriminated. The "difference in waste argon gas" is calculated by the following expression.

Difference in waste argon gas=Hydrogen concentration+Carbon monoxide concentration−2×Oxygen concentration  (6)

In case of the minimum values of the concentration, based on Expression (6), the difference in the waste argon gas is 25 mole ppm (=5+60−2×20).

Furthermore, the "intermittent addition interval" shown in Table 1 is calculated by the following expression.

Intermittent addition interval=Intermittent oxygen injection amount÷{(½)×(Hydrogen flow volume+Carbon monoxide flow volume)−Oxygen flow volume}  (7)

In case of the minimum values of the concentrations, based on Expression (7), the intermittent addition interval is 38.4 min (=4÷{0.5×(0.04167+0.50000)−0.16667}). The flow volumes of the impurities and the intermittent addition intervals in other cases can be calculated in the same manner.

In all calculation results shown in Table 1, the difference after the catalytic reaction (a total amount of the surplus hydrogen and carbon monoxide or an amount of the surplus oxygen) is zero.

In case of the waste argon gas in each of Example 1 and Example 2 shown in Table 1, flow volumes of the impurities obtained by a calculation, an actually measured intermittent addition interval and an actually measured difference after a catalytic reaction when the refinement was performed by using the recovering and refining apparatus 10 for an argon gas according to the present invention shown in FIG. 5 are shown in Table 2. The oxygen is surplus when the difference after the catalytic reaction has a positive sign, and a total amount of the hydrogen and the carbon monoxide is surplus when the same has a negative sign.

TABLE 2

|  | Unit | Example 1 | Example 2 |
|---|---|---|---|
| Waste argon gas flow volume | Nm3/hr | 487 | 498 |
| Hydrogen concentration | Mole ppm | 7 | 3 |
| Oxygen concentration | Mole ppm | 23 | 27 |
| Carbon monoxide concentration | Mole ppm | 65 | 95 |
| Difference in waste argon gas | Mole ppm | 26 | 44 |
| Intermittent oxygen injection amount | NL | 4.0 | 4.0 |
| Hydrogen flow volume | NL/min | 0.05682 | 0.02500 |
| Oxygen flow volume | NL/min | 0.18668 | 0.22500 |
| Carbon monoxide flow volume | NL/min | 0.52758 | 0.79167 |
| Intermittent addition interval | min | 36.1 | 23.2 |
| Difference after catalytic reaction | NL | 0.382 | −0.507 |

Next, impurity concentrations in the argon gas after the refinement of the waste argon gas shown in the columns of Example 1 and Example 2 in Table 2 were measured, and results are as described below.

Impurity concentrations in the refined argon gas
Hydrogen<1 mole ppm
Oxygen<1 mole ppm
Carbon monoxide<1 mole ppm
Carbon dioxide<1 mole ppm
Nitrogen<2 mole ppm In this manner, the refined argon gas had the purity which is sufficient for reuse in the silicon single crystal manufacturing apparatus.

As described above, the recovering and refining apparatus for an argon gas and the method for refining an argon gas according to the present invention are configured to recover, refine, and reuse the argon gas as a furnace atmospheric gas in the silicon single crystal manufacturing apparatus (the CZ apparatus or the FZ apparatus), costs of the recovering and refining apparatus can be reduced, the apparatus can be stably operated, and contribution to energy saving can be achieved.

It is to be noted that the present invention is not restricted to the embodiment. The embodiment is an illustrative example, and any example which has substantially the same configuration and exerts the same functions and effects as the technical concept described in claims of the present invention is included in the technical scope of the present invention.

The invention claimed is:

1. A method for refining an argon gas, in which oxygen is added to the argon gas containing at least one of hydrogen, carbon monoxide, and oxygen as impurities so that the hydrogen and the carbon monoxide contained in the argon gas are converted into water and carbon dioxide by using a catalytic reaction in a catalyst tower, or hydrogen is added to the argon gas so that the oxygen contained in the argon gas is converted into the water by using a catalyst reaction in the catalyst tower, and at least one of the hydrogen, the carbon monoxide, and the oxygen is thereby removed from the argon gas, the method comprising the steps of:
installing (A) at least one of oxygen adding means and hydrogen adding means, (B) the catalyst tower, and (C) detecting means in this order toward a downstream side,
monitoring at least one of the hydrogen, the carbon monoxide, and the oxygen at the detecting means installed on an outlet side of the catalyst tower; and
at least one of adding the oxygen to the argon gas at the oxygen adding means installed on an inlet side of the catalyst tower when any one of the hydrogen and the carbon monoxide is detected at the detecting means installed on the outlet side of the catalyst tower, and adding the hydrogen to the argon gas at the hydrogen adding means installed on the inlet side of the catalyst tower when the oxygen is detected at the detecting means installed on the outlet side of the catalyst tower,
wherein the oxygen or the hydrogen to be added is intermittently added to the catalyst tower relative to continuous supply of the argon gas to the catalyst tower, and at least one of the hydrogen, the carbon monoxide, and the oxygen contained in the argon gas is thereby removed,
wherein the method comprises none of the steps of, on a downstream side of the catalyst tower, removing oxygen, which is surplus due to the catalytic reaction, by an oxidative reaction with a metal, and removing hydrogen, which is surplus due to the catalytic reaction, by a reductive reaction with a metal.

2. The method for refining an argon gas according to claim 1, wherein a total amount of the hydrogen and the carbon monoxide contained in the argon gas to be refined is compared with an amount of the oxygen contained in the argon gas to be refined, the oxygen is added when the total amount of the hydrogen and the carbon monoxide exceeds a double of the amount of the oxygen in terms of a mole equivalent ratio, and the hydrogen is added when the total amount of the hydrogen and the carbon monoxide is less than the double of the amount of the oxygen in terms of a mole equivalent ratio.

3. The method for refining an argon gas according to claim 1, wherein the argon gas to be refined is a waste argon gas which is discharged from a silicon single crystal manufacturing apparatus.

4. The method for refining an argon gas according to claim 2, wherein the argon gas to be refined is a waste argon gas which is discharged from a silicon single crystal manufacturing apparatus.

5. The method for refining an argon gas according to claim 1, wherein an amount of the oxygen or the hydrogen which is intermittently added is adjusted to be equalized with a stoichiometric amount of oxygen or hydrogen which is insufficient due to the catalytic reaction during a time when the oxygen and the hydrogen are not added.

* * * * *